(12) United States Patent
Itou

(10) Patent No.: US 8,644,981 B2
(45) Date of Patent: Feb. 4, 2014

(54) SUBSTRATE PROCESSING APPARATUS, SUBSTRATE PROCESSING METHOD AND STORAGE MEDIUM

(75) Inventor: Kouichi Itou, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 237 days.

(21) Appl. No.: 13/222,141

(22) Filed: Aug. 31, 2011

(65) Prior Publication Data
US 2012/0065770 A1 Mar. 15, 2012

(30) Foreign Application Priority Data
Sep. 13, 2010 (JP) .................................. 2010-204681

(51) Int. Cl.
*G06F 7/00* (2006.01)

(52) U.S. Cl.
USPC ........................................................ 700/214

(58) Field of Classification Search
USPC ........................................................ 700/214
See application file for complete search history.

(56) References Cited

U.S. PATENT DOCUMENTS

| 2007/0048451 A1* | 3/2007 | White et al. ................... 427/402 |
| 2008/0051930 A1* | 2/2008 | Oh et al. ........................ 700/214 |
| 2009/0299515 A1* | 12/2009 | Kaneko et al. ................ 700/109 |

FOREIGN PATENT DOCUMENTS

| JP | 2001-274224 A | 10/2001 |
| JP | 2002-033369 A | 1/2002 |
| JP | 2007-324365 A | 12/2007 |
| JP | 2009-065212 A | 3/2009 |

* cited by examiner

*Primary Examiner* — Ramya Burgess
(74) *Attorney, Agent, or Firm* — Abelman, Frayne & Schwab

(57) ABSTRACT

Disclosed is a substrate processing apparatus in which a target substrate is taken out from a slot of a cassette having a plurality of slots and processed. The substrate processing apparatus includes a substrate processing unit that processes the target substrate, a transfer unit that transfers the target substrate from the cassette to the substrate processing unit and transfers the target substrate processed in the substrate processing unit from the substrate processing unit to the cassette, and a confirming unit that determines whether or not the slot is empty. The substrate processing apparatus further includes a control unit that reads the slot designated to the target substrate and makes the confirming unit to determine whether or not the slot is empty, after the target substrate has been processed in the substrate processing unit but before the target substrate is disposed in the cassette.

3 Claims, 9 Drawing Sheets

SUBSTRATE PROCESSING APPARATUS, SUBSTRATE PROCESSING METHOD AND STORAGE MEDIUM

CROSS-REFERENCE TO RELATED APPLICATIONS

This application is based on and claims priority from Japanese Patent Application No. 2010-204681 filed on Sep. 13, 2010 with the Japanese Patent Office, the disclosure of which is incorporated herein in its entirety by reference.

TECHNICAL FIELD

The present disclosure relates to a substrate processing apparatus in which a target substrate is taken out from a slot of a cassette having a plurality of slots each configured to accommodate a substrate and processed, a substrate processing method, and a computer-readable recording medium storing a computer executable program that, when executed, causes a computer to execute the substrate processing method.

BACKGROUND

A substrate processing apparatus in which a wafer (a substrate to be processed) is taken out from a slot of a cassette having a plurality of slots each configured to accommodate a wafer, and subjected to a predetermined process such as a cleaning process, has been traditionally known. In the known substrate processing apparatus, the wafer is carried out from the cassette sequentially from upper side of slots and processed. Then, the wafer having been processed is carried in to the cassette sequentially from upper side of slots and disposed.

However, it is required to dispose the wafer at any slot in the cassette for several reasons such as, for example, to investigate the cause of troubles generated at the wafer, or to simplify the post-processing.

In this regard, the number of positions in which wafers are disposed in a substrate processing unit where a cleaning process is performed and a transfer unit that transfers the wafers in a substrate processing apparatus, is generally smaller than the number (e.g., twenty five sheets) of wafers to be accommodated in the cassette. Therefore, if a wafer having been processed was disposed at an arbitrary slot without any consideration, it is possible that the wafer having been processed may be placed on a slot in which an unprocessed wafer is not carried out therefrom yet, thereby overlapping with the unprocessed slot.

It has been known that while a wafer is being processed in a substrate processing unit, wafers received in a cassette other than the wafer being processed are re-arranged in a predetermined order based on wafer numbers. See, for example, Japanese Patent Application No. 2002-33369.

SUMMARY

According to an exemplary embodiment of the present disclosure, a substrate processing apparatus is provided in which a target substrate is taken out from a slot of a cassette having a plurality of slots each configured to accommodate a substrate, and processed. The substrate processing apparatus includes a substrate processing unit that processes the target substrate, a transfer unit that transfers the target substrate from the cassette to the substrate processing unit and transfers the target substrate processed in the substrate processing unit from the substrate processing to the cassette so as to dispose the target substrate in the cassette, a confirming unit that confirms whether or not the slot is empty, and a control unit that reads the slot designated to the target substrate and makes the confirming unit to confirm whether or not the slot is empty, after the target substrate has been processed in the substrate processing unit but before the target substrate is disposed in the cassette.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
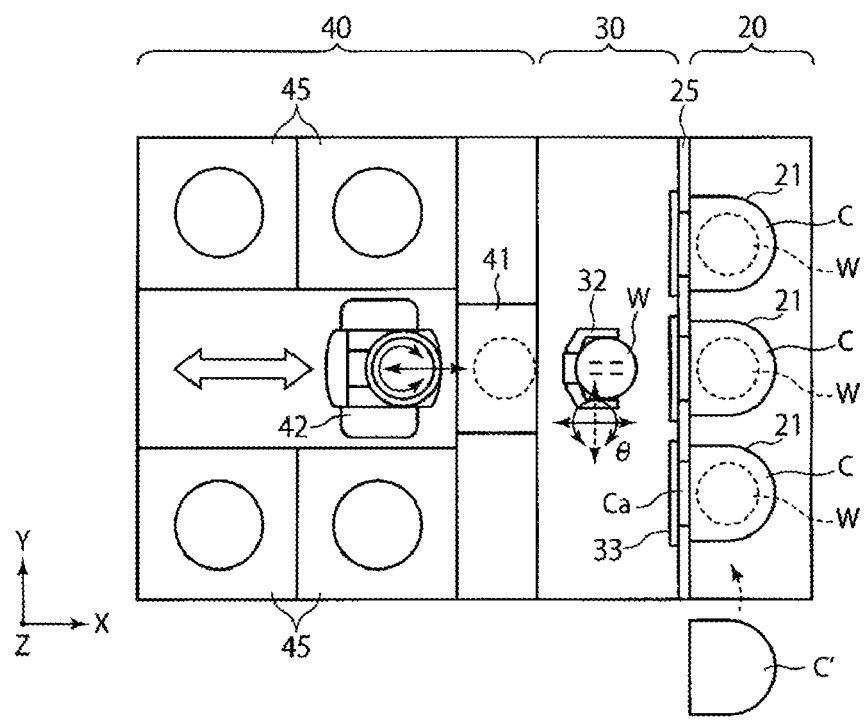
FIG. 1 is an upper plan view illustrating the configuration of a substrate processing apparatus according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure provides a substrate processing apparatus, a substrate processing method, and a recording medium in which a target substrate having been processed is not erroneously disposed at the slot where an unprocessed substrate is disposed thereon, and the target substrate is disposed at an empty slot in the cassette.

According to an exemplary embodiment of the present disclosure, a substrate processing apparatus is provided in which a target substrate is taken out from a slot of a cassette having a plurality of slots each configured to accommodate a substrate and processed. The substrate processing apparatus comprises a substrate processing unit configured to process the target substrate; a transfer unit configured to transfer the target substrate from the cassette to the substrate processing unit, and transfer the target substrate processed in the substrate processing unit from the substrate processing unit to the cassette so as to dispose the target substrate in the cassette; a confirming unit configured to determine whether or not the slot is empty; and a control unit configured to read the slot designated to the target substrate, and make the confirming unit to determine whether or not the slot is empty, after the target substrate has been processed in the substrate processing unit but before the target substrate is disposed in the cassette.

In the substrate processing apparatus according to the present disclosure, the control unit may stop the transfer of the substrate to the slot by the transfer unit when the confirming unit determines that the slot is not empty.

The substrate processing apparatus according to the present disclosure may further include an alert unit configured to alert that the slot is not empty when the confirming unit determines that the slot read by the control unit is not empty.

In the substrate processing apparatus according to the present disclosure, the transfer unit may carry out another target substrate different from the target substrate from the cassette when the slot read by the control unit is not empty.

In the substrate processing apparatus according to the present disclosure, the confirming unit may determine again whether or not the slot read by the control unit is empty, after the transfer unit carried-out the another target substrate different from the target substrate from the cassette.

The substrate processing apparatus according to the present disclosure may further include an alert unit configured to alert that the slot is not empty when the slot read by the control unit is not empty, after the transfer unit carried-out the another target substrate different from the target substrate from the cassette.

The substrate processing apparatus according to the present disclosure may further include an emergency cassette configured to carry-in the target substrate having been processed in the substrate processing unit, when the confirming unit determines that the slot read by the control unit is not empty and the transfer unit is not able to carry-out the another target substrate different from the target substrate from the cassette.

The substrate processing apparatus according to the present disclosure may further include a buffer unit configured to carry-in and accommodate the target substrate by the transfer unit when the confirming unit determines that the slot read by the control unit is not empty.

In the substrate processing apparatus according to the present disclosure, a next target substrate that is processed after the target substrate, may be accommodated in the buffer unit when the target substrate is accommodated in the buffer unit.

In the substrate processing apparatus according to the present disclosure, a next target substrate that is processed after the target substrate may be accommodated in the slot when the slot read by the control unit is empty, even if the target substrate is accommodated in the buffer unit.

In the substrate processing apparatus according to the present disclosure, a plurality of target substrates that have been processed in the substrate processing unit may be accommodated in the buffer unit, and each of the plurality of target substrates accommodated in the buffer unit may be disposed in the cassette sequentially from upper side of slots.

In the substrate processing apparatus according to the present disclosure, the confirming unit may determine again whether or not the slot read by the control unit is empty, after the transfer unit carried-out the another target substrate different from the target substrate from the cassette.

According to another exemplary embodiment of the present disclosure, a substrate processing method is provided in which a target substrate is taken out from a slot of a cassette having a plurality of slots each configured to accommodate a substrate and processed. The method comprises transferring the target substrate from the cassette to a substrate processing unit; processing the target substrate in the substrate processing unit; transferring the target substrate processed in the substrate processing unit from the substrate processing unit to the cassette, thereby disposing the target substrate in the cassette; and reading the slot designated to the target substrate and determining whether or not the slot is empty, after the target substrate has been processed in the substrate processing unit but before the target substrate is disposed in the cassette.

According to another exemplary embodiment of the present disclosure, there is provided a recording medium storing an executable program that, when executed, causes a computer to execute the substrate processing method described above.

According to the present disclosure, the slot designated to the target substrate is read and determined whether or not the slot is empty, after the target substrate has been processed in the substrate processing unit but before the target substrate is disposed in the cassette. Therefore, a target substrate having been processed is not erroneously disposed on a slot, in which an unprocessed target substrate is not carried out yet, and may be disposed at an empty slot on the cassette.

First Exemplary Embodiment

Hereinafter, a substrate processing apparatus, a substrate processing method and recording medium according to a first exemplary embodiment of the present disclosure, will be described with reference to the figures. Herein, FIGS. 1 to 5 are views that illustrate the first exemplary embodiment of the present disclosure.

Figure 2:
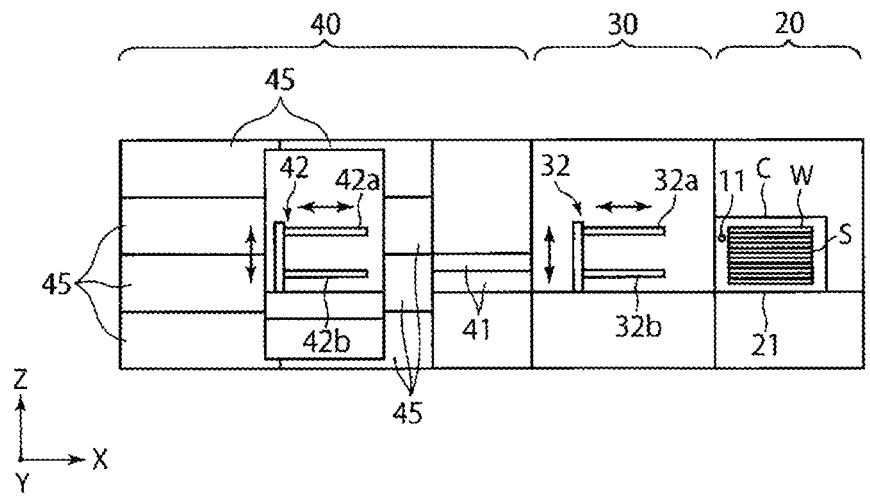
FIG. 2 is a side cross-sectional view illustrating the configuration of the substrate processing apparatus according to the first exemplary embodiment of the present disclosure.

The substrate processing apparatus of the present exemplary embodiment takes out a semiconductor wafer ("wafer W"), that is a target substrate, from a cassette C such as FOUP and processes. As shown in FIG. 2, cassette C is provided with a plurality of slots S (e.g., 25 slots) that are disposed with a predetermined space each other, each slot configured to accommodate a wafer W. Further, wafer W within slot S is accommodated in a substantially horizontal position such that the surface (a processed surface on which semiconductor devices are formed) of wafer W becomes an upper surface. In addition, while the present exemplary embodiment may use wafer W as a target substrate, a different substrate such as a glass substrate may be used as a target substrate.

As shown in FIG. 1, the substrate processing apparatus includes a disposing area 20 in which wafer W is disposed before and after the processing, a processing area 40 that in which the processing such as a cleaning for wafer W is performed, and a transfer area 30 that transfers wafer W between disposing area 20 and processing area 40.

A window portion (an opening) and a window portion opening/closing mechanism 33 including a shutter that opens/closes the window portion, are installed in a partitioning wall 25 provided between disposing area 20 and transfer area 40. In addition, when cassette C described above is attached onto a disposing table (a disposing part) 21, a cover Ca of cassette C is opposed to the window portion.

Furthermore, a transfer unit 41 that is connected to transfer area 30, a substrate processing unit (a substrate processing part) 45 that processes wafer W by cleaning, and a transfer unit 42 for processing area that transfers wafer W within processing area 40 are installed in processing area 40. Among those, a plurality of transfer units 41 (for example, two transfer units in the present exemplary embodiment as shown in FIG. 2) are installed stacked each other in a vertical direction.

In addition, a plurality of substrate processing units 45 (for example, 4×4=16 substrate processing units in the present exemplary embodiment as shown in FIGS. 1 and 2) are installed. Specifically, substrate processing units 45 are installed in four blocks as shown in FIG. 1 and four substrate processing units 45 are stacked in each block as shown in FIG. 2. Further, as a substrate processing unit 45, for example, a single sheet type cleaning unit may be used.

Further, transfer unit 42 for processing area is movable in an X-direction (a left-right direction in FIG. 1) and a Y-direction (a vertical direction in FIG. 1). In addition, as shown in FIG. 2, transfer unit 42 for processing area has two wafer holding arms 42a and 42b, which are configured to hold wafer W, with a space in a height direction. Each of wafer holding arms 42a and 42b is rotatable in an X-Y plane (in a θ-direction), movable in a Z-direction (a direction perpendicular to the X-Y plane), and freely movable in a forward and backward, independently. Transfer unit 42 for processing area has a general driving mechanism (not shown) that drives, for example, wafer holding arms 42a and 42b.

Further, transfer unit 32 for carrying-in/out that transfers wafer W between transfer unit 41 and cassette C disposed in disposing area 20 is installed in transfer area 30. Transfer unit 32 for carrying-in/out is movable in an X-direction and a Y-direction. In addition, as shown in FIG. 2, transfer unit 32 for carrying-in/out has two wafer holding arms 32a and 32b, which are configured to hold wafer W, with a space in a height direction. Each of wafer holding arms 32a and 32b is rotatable in an X-Y plane (in a θ-direction), movable in a Z-direction, and freely movable in a forward and backward, independently. Transfer unit 32 for carrying-in/out has a general driving mechanism (not shown) that drives, for example, wafer holding arms 32a and 32b.

In addition, transfer unit 32 for carrying-in/out is configured to transfer wafer W from cassette C to transfer unit 41, and transfer unit 42 for processing area is configured to transfer wafer W from transfer unit 41 to substrate processing unit 45. In addition, transfer unit 42 for processing area is configured to transfer wafer W processed in substrate processing unit 45 from substrate processing unit 45 to transfer unit 41, and transfer unit 32 for carrying-in/out is configured to transfer wafer W from transfer unit 41 to cassette C.

Further, in the present exemplary embodiment, a computer executable program that executes a substrate processing method as described below in the substrate processing apparatus is stored in a recording medium 56 (see, for example, FIG. 3). And, the substrate processing apparatus also includes a computer 55 that receives recording medium 56. A control unit 50 is configured to control the substrate processing apparatus itself by receiving a signal from computer 55. Further, in the present disclosure, recording medium 56 refers to, for example, a CD, a DVD, a MD, a hard disk, a RAM, and so on.

The present exemplary embodiment is configured such that an operator, using computer 55 or recording medium 56 as a recipe, designates a slot S from which an unprocessed wafer W is taken out and a slot S in which wafer W is to be accommodated after processing in substrate processing unit 45 for each wafer W.

Figure 3:
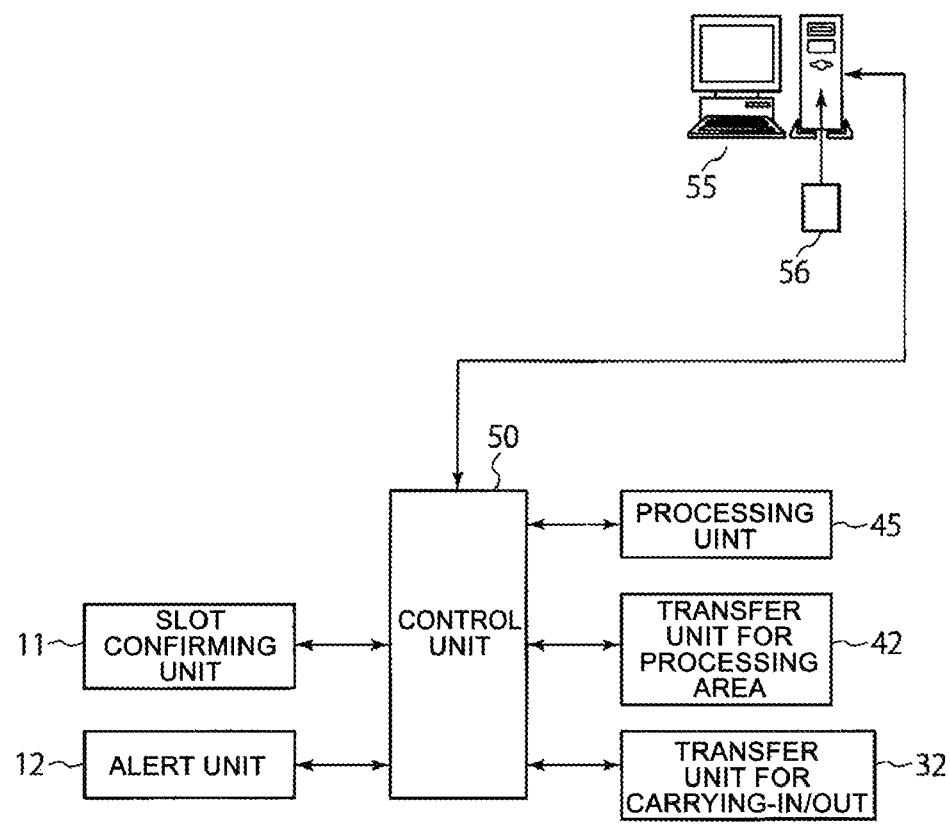
FIG. 3 is a view explaining the flow of signals in the substrate processing apparatus according to the first exemplary embodiment of the present disclosure.

As shown in FIG. 3, substrate processing unit 45, transfer unit 42 for processing area, and transfer unit 32 for carrying-in/out are connected to control unit 50 that controls them. Control unit 50 is configured to read slot S from which wafer W is taken out by computer 55 or recording medium 56, before taking out an unprocessed wafer W from cassette C. Further, control unit 50 is configured to read slot S designated for each wafer W having been processed in substrate processing unit 45 to be accommodated from computer 55 or recording medium 56, after wafer W has been processed in substrate processing unit 45, but before wafer W is disposed in cassette C. And, control unit 50 is connected to a confirming unit 11 that determines whether or not slot S read from control unit 50 is empty. Furthermore, control unit 50 is connected to an alert unit 12 that alerts or displays an alert indication when confirming unit 11 determines that slot S read by control unit 50 is not empty As confirming unit 11, a sensor, that is, for example, installed in each slot S and determines whether or not wafer W is disposed within slot S, or an image detecting unit that determines whether or not wafer W is disposed within slot S by imaging, can be used.

Figure 4A:
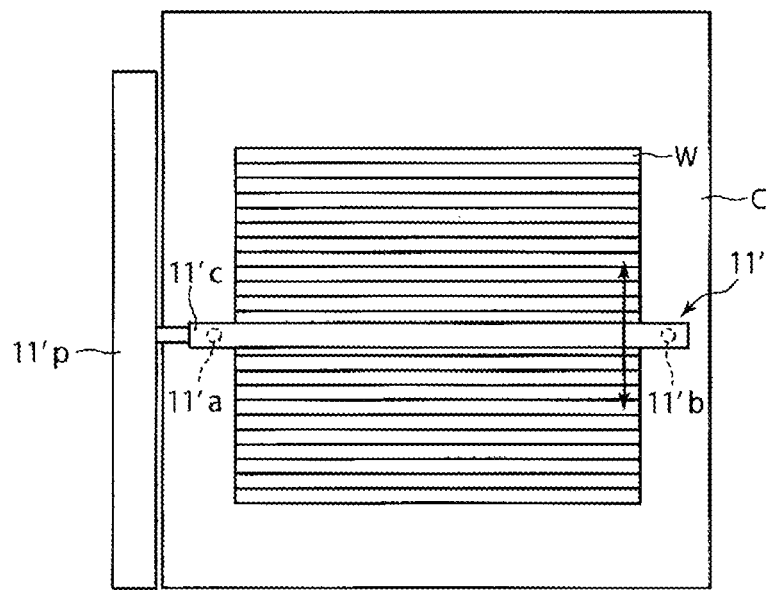
FIG. 4 is a front view and an upper plan view that explains an example of a confirming unit of the substrate processing apparatus according to the first exemplary embodiment of the present disclosure.
Figure 4B:
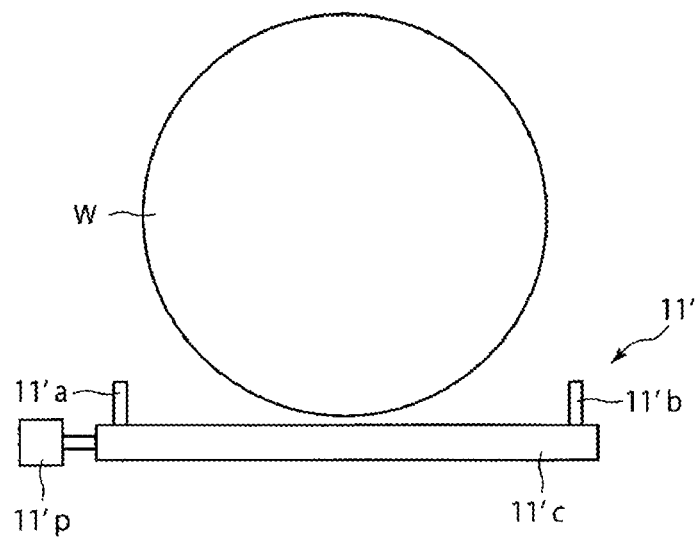

Hereinafter, an example will be described where a sensor 11' is used as confirming unit 11. As shown in FIGS. 4(a) and 4(b), sensor 11' includes an illuminating unit 11'a that illuminates a light and a light receiving unit 11'b that receives the light illuminated by illuminating unit 11'a. Illuminating unit 11'a and light receiving unit 11'b are supported by a supporting unit 11'c that extends in a plane-direction of wafer W disposed at slot S. When the light illuminated by illuminating unit 11'a is received in light receiving unit 11'b, it means that wafer W is not disposed at slot S, and when the light illuminated by illuminating unit 11'a is blocked by wafer W and not received in light receiving unit 11'b, it means that wafer W is disposed at slot S. Further, supporting unit 11'c is movable in a vertical direction along a vertical shaft 11'p, that is extended in a vertical direction, based on a driving force applied by a driving unit (not shown) (see, for example, an arrow in FIG. 4(a)). In this way, it is sensed whether or not wafer W is disposed each slot S by moving supporting unit 11'c in the vertical direction.

Control unit 50 of the present exemplary embodiment is configured to stop the transfer by transfer unit 32 for carrying-in/out toward a designated slot S, and alert the operator that slot S is not empty by alert unit 12, when confirming unit 11 determines that designated slot S is not empty.

In addition, an unprocessed wafer W can be taken out from cassette C even when designated slot S is not empty. Therefore, whenever an unprocessed wafer W is carried-out from cassette C by transfer unit 32 for carrying-in/out, control unit 50 makes confirming unit 11 to determine again whether or not the designated slot S is empty. Further, transfer unit 32 for carrying-in/out transfers wafer to slot S when slot S to be designated is empty, but the transfer toward slot S by transfer unit 32 for carrying-in/out is continuously stopped as long as slot S is not empty. In addition, in such a case, alert unit 12 may alert operator that slot S is not empty. However, when the transfer toward slot S by transfer unit 32 for carrying-in/out is stopped, wafer W to be transferred may stop while being held by wafer holding arm 32a, or may stop while being disposed in transfer unit 41.

Furthermore, when confirming unit 11 determines that designated slot S is not empty and even when transfer unit 32 for carrying-in/out cannot take out unprocessed wafer W from cassette C, an emergency cassette C' that receives wafer W having been processed in substrate processing unit 45 may be installed at disposing table 21, as represented by the dotted arrow in FIG. 1. Carrying-in toward emergency cassette C' is performed by transfer unit 42 for processing area and transfer unit 32 for carrying-in/out. However, the case where transfer unit 32 for carrying-in/out cannot take out wafer W from cassette C includes a case where since wafer W is disposed each of all the unit including 16 substrate processing units 45, two transfer units 41 and transfer unit 42 for processing area, even though an unprocessed wafer W is selected and taken out from cassette C, the selected wafer W cannot be carried-in any place.

Figure 5:
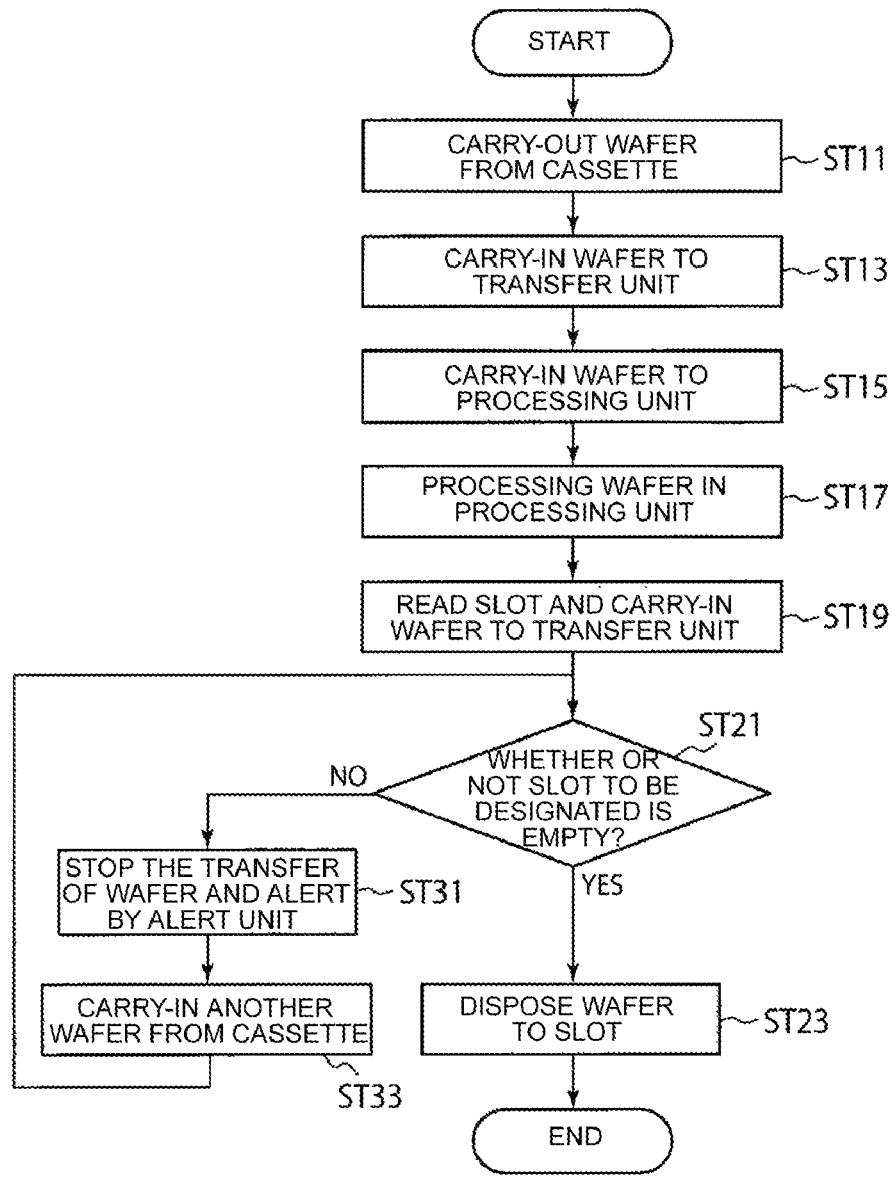
FIG. 5 is a view illustrating a flow to explain the substrate processing method according to the first exemplary embodiment of the present disclosure.

Next, the action and effects of the present exemplary embodiment composed of such configuration will be described mainly with reference to FIG. 5.

First, cassette C into which wafers W to be processed, for example, twenty-five (25) sheets of wafers W are accommodated is attached on disposing table 21.

Next, window portion opening/closing mechanism 33 and cover Ca of cassette C are opened.

Next, slot S from which wafer W is taken out by control unit 50 is read from computer 55 or recording medium 56. In addition, the present exemplary embodiment is explained with an aspect in which wafers W are taken out from cassette C sequentially from upper side of slots S.

Next, confirming unit 11 determines whether or not wafer W is disposed at a slot S from which wafer W is taken out (an uppermost slot S). And, wafer W disposed within cassette C is lifted up and carried out by transfer unit 32 for carrying-in/out, for example, by the low-ended wafer holding arm 32b (see ST11).

Then, wafer holding arm 32b is retreated and rotated, and transfer unit 32 for carrying-in/out is moved so that wafer W taken out from cassette C is carried-in to, for example, the lower end of transfer unit 41 (see ST13).

Next, wafer W disposed within transfer unit 41 is received by transfer unit 42 for processing area, for example, by lower-ended wafer holding arm 42b, and is carried-in to substrate processing unit 45 that is designated by, for example, a recipe (see ST15).

Next, a predetermined processing such as a cleaning is performed for wafer W having been carried-in within substrate processing unit 45 (see ST17).

And, wafer W in which the predetermined processing has been performed is received by transfer unit 42 for processing area and carried-in to transfer unit 41. In this case, wafer W is held by, for example, upper-ended wafer holding arm 42a of transfer unit 42 for processing area and carried-in to, for example, upper-ended transfer unit 41 (see ST19).

Moreover, as described above, once the predetermined processing such as a cleaning has been performed for wafer W, then, control unit 50 reads a place about slot S designated for wafer W (see ST19). And, confirming unit 11 determines whether or not slot S is empty.

Herein, when slot S to be designated is empty (see "YES" in ST21), wafer W is carried-in by transfer unit 32 for carrying-in/out and disposed to slot S from transfer unit 41 (see ST23), and a series of processes for one sheet of wafer W are completed.

However, when slot S is not empty (see "NO" in ST21), control unit 50 stops the transfer by transfer unit 32 for carrying-in/out toward slot S (see ST31). And, at this time, alert unit 12 receives a signal from control unit 50 and alerts operator that slot S is not empty (see ST31). Furthermore, when the transfer toward slot S by transfer unit 32 for carrying-in/out is stopped, wafer W to be transferred may stop while being held by wafer holding arm 32a, or may stop while being disposed in transfer unit 41.

In addition, wafer W can be taken out from cassette C even if the designated slot S is not empty. For this reason, another wafer W that is new and unprocessed is carried-out from cassette C by transfer unit 32 for carrying-in/out (see ST33) and carried-in to transfer unit 41.

Further, when slot S to be designated is empty (see "YES" in ST21), wafer W is carried-in by wafer holding arm 32a and disposed to slot S or is carried-in by transfer unit 32 for carrying-in/out and disposed to slot S from transfer unit 41 (see ST23).

However, while slot S is being not empty, the transfer by transfer unit 32 for carrying-in/out toward slot S is continuously stopped. In addition, at this time, alert unit 12 may continuously alert operator that slot S is not empty.

However, whether or not designated slot S is empty may be determined either by sensing only slot S to be designated with confirming unit 11 composed of, for example, sensor 11' (see FIGS. 4(a) and 4(b)), or by sensing all slots S with confirming unit 11 composed of, for example, an image sensing unit.

Furthermore, in the present exemplary embodiment, other unprocessed wafers W are repeatedly carried-out as described above, and confirming unit 11 determines whether or not designated slot S is empty whenever other unprocessed wafers W are carried-out from cassette C. Further, such determination by confirming unit 11 may not be performed whenever other unprocessed wafers W are carried-out from cassette C as in the present exemplary embodiment, and may be performed only when it is predicted that designated slot S is empty based on, for example, a recipe information.

In a case that, although wafer W is repeatedly carried-out from cassette C, slot S to be designated is not empty and any place in which wafer W is disposed thereon is not present (i.e., wafer W cannot be disposed onto any substrate processing units 45, transfer units 41 and transfer unit 42 for processing area), therefore transfer unit 32 for carrying-in/out cannot carry-out wafer W from cassette C, disposing table 21 is provided with emergency cassette C' (see dotted arrow of FIG. 1). Then, all wafers W in the substrate processing apparatus are carried-in and accommodated to emergency cassette C' by transfer unit 42 for processing area and transfer unit 32 for carrying-in/out.

As described above, according to the present exemplary embodiment, slot S designated to each wafer W is read and whether or not designated slot S is empty is determined, after wafer W has been processed in substrate processing unit 45 but before wafer W is disposed in cassette C. And, the transfer by transfer unit 32 for carrying-in/out toward slot S is stopped when slot S is not empty. As a result, wafer W having been processed is not erroneously disposed to slot S in which unprocessed wafer W is yet disposed, but wafer W having been processed is disposed to an empty slot of cassette. Further, although the present disclosure is explained by means of not limited to an aspect in which the transfer by transfer unit 32 for carrying-in/out toward slot S is stopped, but may be explained with an aspect in which the transfer by transfer unit 42 for processing area toward transfer unit 41 is stopped.

In the present exemplary embodiment, alert unit 12 alerts an operator that slot S is not empty when designated slot S is not empty. Therefore, the operator can readily recognize that slot S is not empty.

Furthermore, unprocessed wafers W are repeatedly carried-out, and confirming unit 11 determines whether or not designated slot S is empty whenever an unprocessed wafer W is carried-out from cassette C. Further, when slot S to be designated is empty, wafer W is carried-in by wafer holding arm 32a and disposed to slot S, or is carried-in by transfer unit 32 for carrying-in/out and disposed to slot S from transfer unit 41. Therefore, a stopping time can be extremely short.

Second Exemplary Embodiment

Next, a second exemplary embodiment of the present disclosure will be described with reference to FIGS. 6 to 8.

The first exemplary embodiment discloses an aspect in which control unit 50 stops the transfer by transfer unit 32 for carrying-in/out toward slot S when designated slot S is not empty, and all wafers W are carried-in and accommodated to emergency cassette C' by transfer unit 42 for processing area and transfer unit 32 for carrying-in/out when transfer unit 32 for carrying-in/out cannot carry-out wafer W from cassette finally. In contrast to this, the present exemplary embodiment explains an aspect in which wafer W is carried-in and accommodated to a buffer unit by transfer unit 32 for carrying-in/out when designated slot S is not empty. Specifically, in the present exemplary embodiment, disposing table 21" is provided with a buffer cassette C", as shown in FIG. 6. And, wafer W is carried-in to buffer cassette C" by transfer unit 32 for carrying-in/out when designated slot S of cassette C is not empty. In the second exemplary embodiment, other configurations are similar to that of the first exemplary embodiment except the above. However, a place in which buffer cassette C is disposed is, of course, not limited to disposing table 21". For example, buffer cassette C" may be disposed at a lateral side of transfer unit 41 as shown in FIG. 7(a), or may be disposed at a lateral side of the area in which transfer unit 32 for carrying-in/out moves of transfer area 30 as shown in FIG. 7(b).

Figure 6:
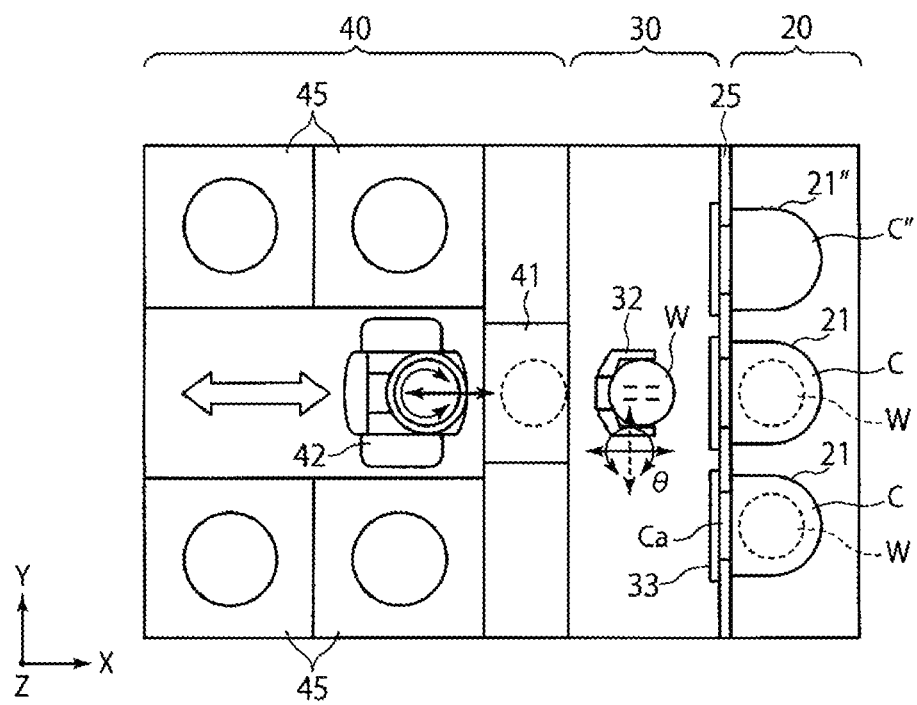
FIG. 6 is an upper plan view illustrating the configuration of a substrate processing apparatus according to a second exemplary embodiment of the present disclosure.
Figure 7A:
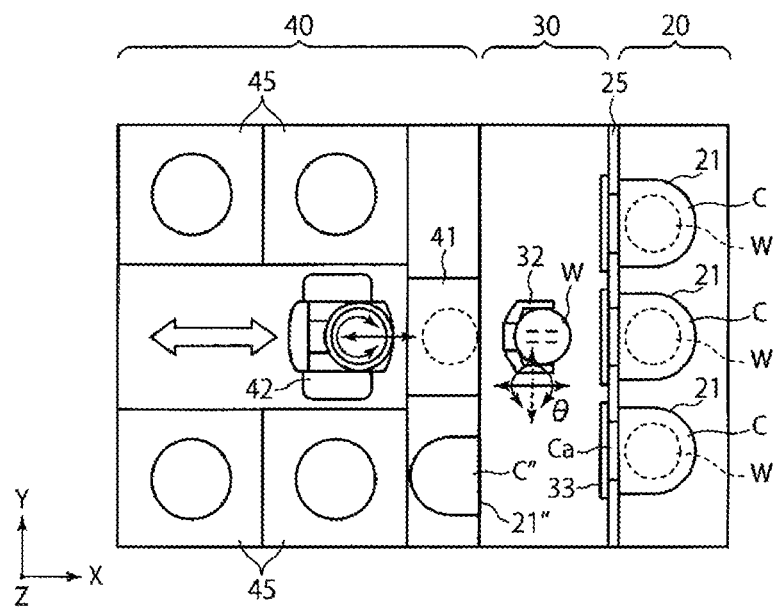
FIG. 7 is an upper plan view illustrating the configuration of a substrate processing apparatus according to a modified example of the second exemplary embodiment of the present disclosure.
Figure 7B:
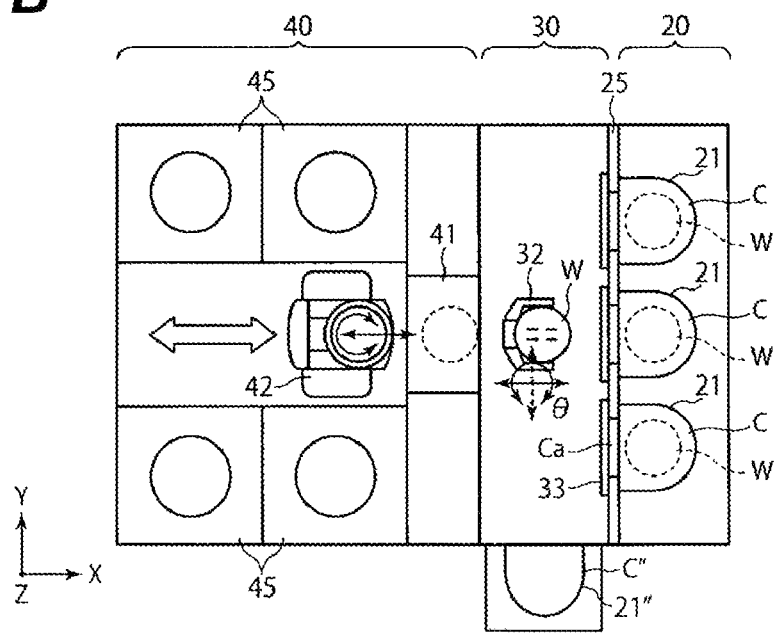
Figure 8:
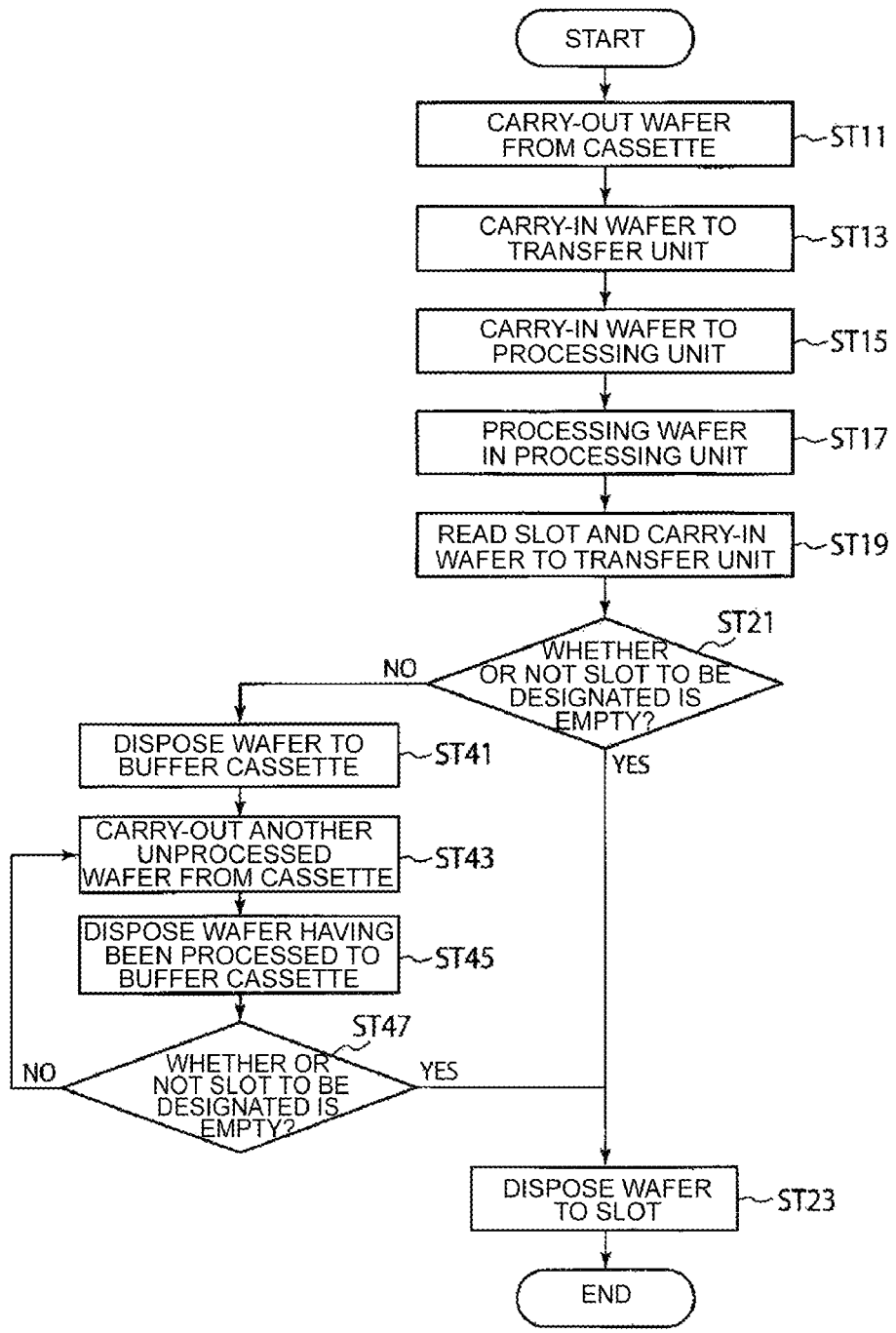
FIG. 8 is a view illustrating a flow that explains the substrate processing method according to the second exemplary embodiment of the present disclosure.

In the second exemplary embodiment as shown in FIGS. 6 to 8, the parts, which are the same as those of the first exemplary embodiment as shown in FIGS. 1 to 5, have same reference numerals, and the detailed description thereof are omitted.

The action and effect of the present exemplary embodiment will be described mainly with reference to FIG. 8. Further, the description for the part that has described in the first exemplary embodiment is appropriately omitted.

First, cassette C into which wafers W to be processed are accommodated is attached on disposing table 21.

Next, window portion opening/closing mechanism 33 and cover Ca of cassette C are opened.

Next, slot S from which wafer W is taken out by control unit 50 is read from computer 55 or recording medium 56.

Next, confirming unit 11 determines whether or not wafer W is disposed at slot S from which wafer W is taken out. And, wafer W disposed within cassette C is taken out and carried out by wafer holding arm 32b of transfer unit 32 for carrying-in/out (see ST11), and then is carried-in to transfer unit 41 (see ST13).

Next, wafer W disposed within transfer unit 41 is received by wafer holding arm 42b of transfer unit 42 for processing area, and is carried-in to substrate processing unit 45 that is designated by, for example, a recipe (see ST15).

Next, a predetermined processing such as a cleaning is performed for wafer W having been carried-in within substrate processing unit 45 (see ST17).

And, wafer W in which the predetermined processing has been performed is received by transfer unit 42 for processing area and carried-in to transfer unit 41 (see ST19).

Moreover, as described above, once the predetermined processing such as a cleaning has been performed for wafer W, then, control unit 50 reads a place about slot S designated for wafer W (see ST19). And, confirming unit 11 determines whether or not slot S is empty.

Herein, when slot S to be designated is empty (see "YES" in ST21), wafer W is carried-in and disposed to slot S from transfer unit 41 (see ST23), and a series of processes for one sheet of wafer W are completed.

Meanwhile, when slot S is not empty (see "NO" in ST21), transfer unit 32 for carrying-in/out is controlled based on the signals from control unit 50, and wafer W is carried-in by transfer unit 32 for carrying-in/out and disposed to buffer cassette C" from transfer unit 41 (Herein, wafer W is also referred to "stand-by wafer W") (see ST41). Further, in this case, wafer W is disposed within, for example, buffer cassette C" sequentially from upper side.

Next, another unprocessed wafer W is carried-out from cassette C by transfer unit 32 for carrying-in/out (see ST43) and carried-in to transfer unit 41. Next, transfer unit 32 for carrying-in/out receives another wafer W in which the predetermined processing such as a cleaning has been processed from transfer unit 41, and carries-in wafer W having been processed and disposes to buffer cassette C" (see ST45).

Further, in the present exemplary embodiment, confirming unit 11 determines whether or not slot S to accommodate stand-by wafer W is empty after unprocessed wafer W has been taken-out from cassette C (i.e., after ST43), but before wafer W having been processed is disposed to buffer cassette C" (i.e., before ST45).

When slot S to accommodate stand-by wafer W is empty by taking-out unprocessed wafer W from cassette C, stand-by wafer W is disposed to slot S of cassette C to accommodate stand-by wafer W from buffer cassette C" by transfer unit 32 for carrying-in/out (see ST23 and "YES" in ST47), after wafer W having been processed has been disposed in buffer cassette C" (i.e., after ST45).

Meanwhile, when slot S to accommodate stand-by wafer W is not empty although unprocessed wafer W is taken out from cassette C (see "NO" in ST47), another wafer W that is new and unprocessed is carried-out from cassette C by transfer unit 32 for carrying-in/out (see ST43) and is carried-in to transfer unit 41.

Hereinafter, processes described above are repeated. Further, while all wafers W disposed in buffer cassette C" are subjected to the processes described above when a plurality of stand-by wafers W are accommodated in buffer cassette C", stand-by wafers W may be sequentially transferred to slot S of cassette C to accommodate stand-by wafer W at the time of slot S to accommodate stand-by wafer W is empty regardless of the order in which stand-by wafers W are accommodated in buffer cassette C", or may be transferred to slot S of cassette C to accommodate stand-by wafer W according to the order in which wafers are accommodated in buffer cassette C".

As described above, according to the present exemplary embodiment, wafer W is first disposed in buffer cassette C" by transfer unit 32 for carrying-in/out and then is disposed in designated slot S, when slot S to accommodate wafer W having been processed is not empty. As a result, wafer W having been processed is not disposed by mistake to slot S in which unprocessed wafer W is yet disposed, but wafer W having been processed may be disposed to cassette C in an empty slot S.

In addition, in the present exemplary embodiment, when a wafer W is accommodated in buffer cassette C", another wafer W having been processed following the wafer W is first disposed and accommodated in buffer cassette C. As a result, once wafer W is accommodated in buffer cassette C", since then wafers W are to be moved with the same movement.

Therefore, the switching of the program is not required thereby simplifying the control.

Furthermore, in the present exemplary embodiment, unprocessed wafers W are repeatedly carried-out, and confirming unit 11 determines whether or not designated slot S is empty whenever an unprocessed wafer W is carried-out from cassette C. And, wafer W is carried-in and disposed to slot S by transfer unit 32 for carrying-in/out from buffer cassette C" when slot S to be designated is empty. As a result, the time period in which wafer W is accommodated in buffer cassette C" can be extremely short.

Modified Example 1

In addition, in the embodiment described above, when a wafer W is accommodated in buffer cassette C", another wafer W having been processed following the wafer W (stand-by wafer W) must be disposed and accommodated in buffer cassette C", but the present disclosure is not limited thereto.

For example, although wafer W (stand-by wafer W) is accommodated in buffer cassette C", wafer W having been processed following stand-by wafer W may be accommodated in slot S when slot S designated for wafer W having been processed following stand-by wafer W is empty.

Specifically, confirming unit 11 determines whether or not slot S to accommodate stand-by wafer W is empty and whether or not slot S to accommodate wafer W having been processed in which transfer unit 32 for carrying-in/out is taking-out from transfer unit 41 is empty, after another unprocessed wafer W has been taken-out from cassette C (after ST43), but before wafer W having been processed is taken-out from transfer unit 41 by transfer unit 32 for carrying-in/out.

And, when slot S to accommodate wafer W having been processed to be taken-out from transfer unit 41 is empty, once wafer W is taken-out from transfer unit 41, then wafer W is directly carried-in and disposed in cassette C at slot S to be accommodated instead of accommodating into buffer cassette C.

As such, according to the present modified example, although wafer W is accommodated in buffer cassette C", when slot S is empty, wafer W to be disposed in slot S frequently is carried-in to cassette C not via buffer cassette C", thereby increasing the productivity.

Modified Example 2

In addition, as another modified example, for example, wafers W having been processed in substrate processing unit 45 are first accommodated in buffer cassette C", and wafers W accommodated in buffer cassette C" may be disposed in cassette C sequentially from upper-side of slots S.

Specifically, when a place of slot S that is designated to wafer W having been processed at first is at the uppermost side of cassette C, wafer W is directly carried-in to slot S from transfer unit 41.

Meanwhile, when a place of slot S that is designated to wafer W is not at the uppermost side of cassette C, wafer W is accommodated in buffer cassette C" at once. And, until wafer W is carried-in to cassette C at the uppermost-side of slots S, all wafers W having been processed are accommodated in buffer cassette C". And, when wafer W to be designated in at the uppermost-side of slots S is presented, wafer W is directly carried-in to slot S from transfer unit 41.

As such, when wafer W is carried-in to the upper most slot S of cassette C, then wafer W to be carried-in at the second uppermost slot S that is second from the uppermost slot S is carried-in to cassette C. That is, when wafer W to be accommodated in second slot S from upper-side is disposed in buffer cassette C", wafer W is carried-in from buffer cassette C" to second slot S of cassette C from upper-side. However, when wafer W to be accommodated in second slot S from upper-side is not disposed in buffer cassette C", wafer W having been processed and having been disposed in transfer unit 41 is sequentially accommodated in buffer cassette C" until wafer W is carried-in to second slot S from upper-side. And, when wafer W to be designated in at the second slot S form upper-side is presented, wafer W is directly carried-in to slot S from transfer unit 41. Thereafter, the processing as described above is performed for wafer W to be carried-in to at the third slot S from the upper-side, wafer W to be carried-in to at the fourth slot S from the upper-side, and so on.

As such, according to the present modified example, wafer W is sequentially disposed at slot S from upper-side. For this reason, wafer holding arms 32*a*, 32*b* of transfer unit 32 for carrying-in/out are not displaced on the upper-side of wafer W having been processed. As a result, it may be prevented that the dust attached on wafer holding arms 32*a*, 32*b* drop onto wafer W having been processed.

Third Exemplary Embodiment

Next, a third exemplary embodiment of the present disclosure will be described with reference to FIGS. 9 and 10.

The second exemplary embodiment explains an aspect in which wafer W is carried-in and accommodated to buffer cassette C" by transfer unit 32 for carrying-in/out when designated slot S is not empty. Meanwhile, in the present exemplary embodiment, a plurality of buffer transfer units 41" are provided (for example, three buffer transfer units 41" as shown in FIG. 9 in the present exemplary embodiment), and wafer W is carried-in and accommodated in buffer transfer unit 41" by transfer unit 42 for processing area when designated slot S is not empty.

Figure 9:
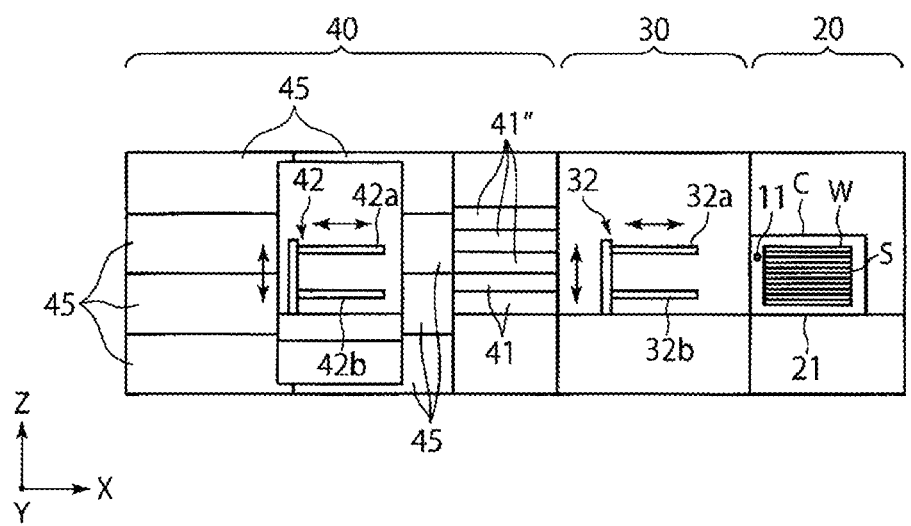
FIG. 9 is a side cross-sectional view illustrating the configuration of a substrate processing apparatus according to a third exemplary embodiment of the present disclosure.
Figure 10:
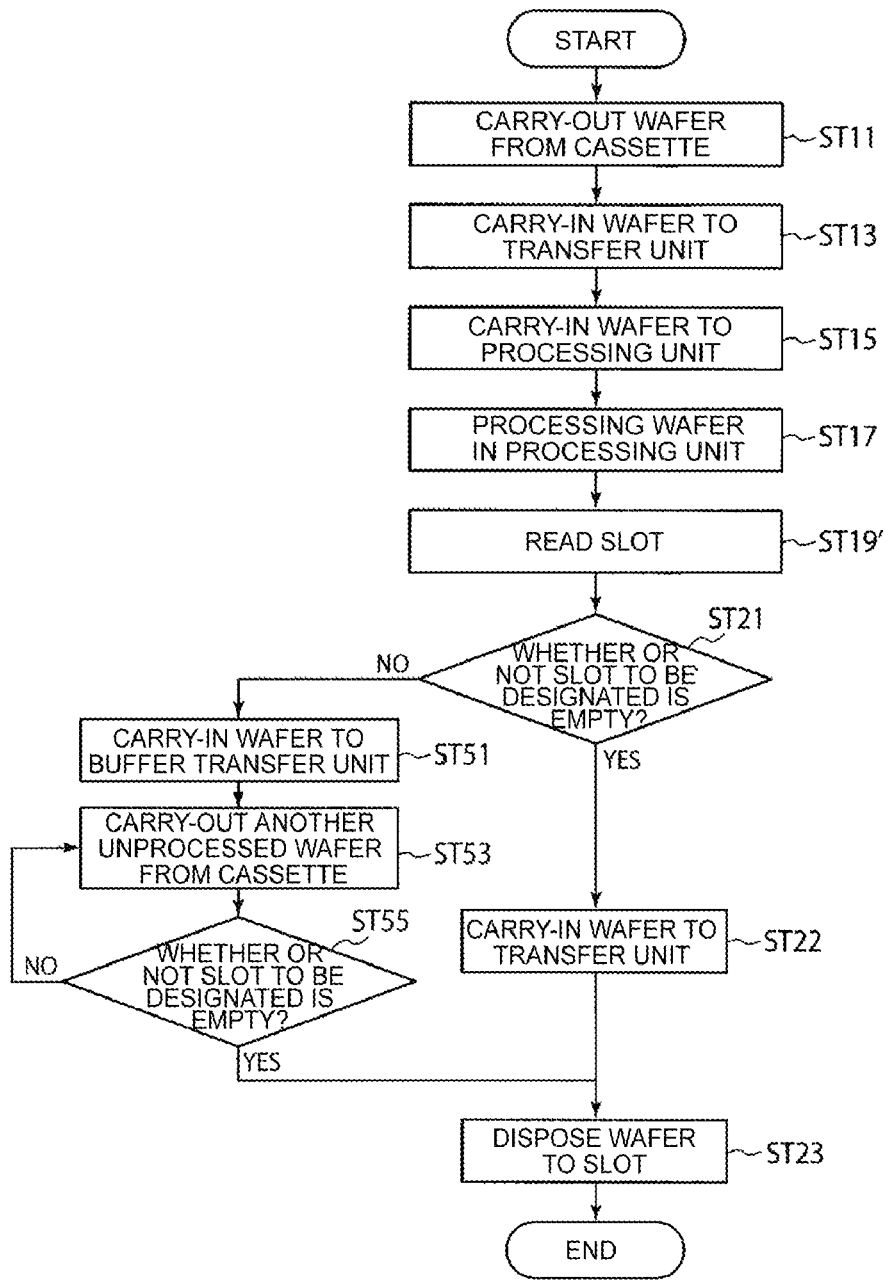
FIG. 10 is a view illustrating a flow that explains the substrate processing method according to the third exemplary embodiment of the present disclosure.

In the third exemplary embodiment as shown in FIGS. 9 and 10, the parts, which are the same to those of the first exemplary embodiment as shown in FIGS. 1 to 5 and of the second exemplary embodiment as shown in FIGS. 6 to 8, have same reference numerals, and the detailed description thereof are omitted.

The action and effects of the present exemplary embodiment will be described mainly with reference to FIG. 10. Further, the description for the part that has described in the first exemplary embodiment and the second exemplary embodiment is appropriately omitted.

First, cassette C into which wafers W to be processed are accommodated is attached on disposing table 21.

Next, window portion opening/closing mechanism 33 and cover Ca of cassette C are opened.

Next, slot S from which wafer W is taken out by control unit 50 is read from computer 55 or recording medium 56.

Next, confirming unit 11 determines whether or not wafer W is disposed at a slot S from which wafer W is taken out. And, wafer W disposed within cassette C is taken out and carried out by wafer holding arm 32*b* of transfer unit 32 for carrying-in/out (see ST11), and then is carried-in to transfer unit 41 (see ST13).

Next, wafer W disposed within transfer unit 41 is received by wafer holding arm 42*b* of transfer unit 42 for processing area, and is carried-in into substrate processing unit 45 that is designated by, for example, a recipe (see ST15).

A predetermined processing such as a cleaning is performed for wafer W having been carried-in within substrate processing unit 45 (see ST17).

Next, control unit 50 reads a place of slot S that is designated for wafer W (see ST19'), and confirming unit 11 determines whether or not slot S is empty.

Herein, when slot S to be designated is empty (see "YES" in ST21), wafer W in which a predetermined processing is performed is received by transfer unit 42 for processing area and is carried-in to transfer unit 41 (see ST22).

And, wafer W is carried-in and disposed to slot S of cassette C to be accommodated from transfer unit 41 by transfer unit 32 for carrying-in/out (see ST23), then a series of processes for one sheet of wafer W are completed.

Meanwhile, when slot S to be designated is not empty (see "NO" in ST21), transfer unit 42 for processing area is controlled based on the signals from control unit 50, and wafer W is carried-in and disposed to buffer transfer unit 41" by transfer unit 42 for processing area (see ST51).

Next, another unprocessed wafer W is carried-out from cassette C by transfer unit 32 for carrying-in/out (see ST53), and carried-in to transfer unit 41.

Next, confirming unit 11 determines whether or not slot S to accommodate stand-by wafer W is empty.

Further, when slot S to accommodate stand-by wafer W is empty by taking-out unprocessed wafer W from cassette C (see "YES" in ST55), stand-by wafer W that is disposed in buffer transfer unit 41" is disposed to slot S to be accommodated of cassette C by transfer unit 32 for carrying-in/out (see ST23). Also, although the present exemplary embodiment explains an aspect in which stand-by wafer W is directly transferred to slot S of cassette C from buffer transfer unit 41", the present exemplary embodiment is not limited thereto. That is, once stand-by wafer W is transferred to transfer unit 41, then stand-by wafer W may be transferred to slot S of cassette C from transfer unit 41.

Meanwhile, when slot S to accommodate stand-by wafer W is not empty although unprocessed wafer W is taken out from cassette C (see "NO" in ST55), wafer W that is new and unprocessed is carried-out from cassette C by transfer unit 32 for carrying-in/out and is carried-in to transfer unit 41. Hereinafter, processes described above are repeated.

In addition, each wafer W having been processed is disposed in buffer transfer unit 41" when slot S to be designated is not empty. And, as a method, wafer having been processed following stand-by wafer W may surely be accommodated in buffer transfer unit 41" when stand-by wafer W is accommodated in buffer transfer unit 41", and although wafer W is accommodated in buffer transfer unit 41" wafer having been processed following stand-by wafer W may be disposed in slot S to be designated instead of being disposed in buffer transfer unit 41" when slot S that is designated to wafer W having been processed following stand-by wafer W, is empty.

Further, since the present exemplary embodiment has three buffer transfer units 41", three wafers W are capable of being disposed in buffer transfer unit 41", but more wafers W may stand-by by increasing the number of buffer transfer unit 41".

However, when a plurality of stand-by wafers W are accommodated in buffer transfer units 41", stand-by wafers W may be sequentially transferred to slot S of cassette C to accommodate stand-by wafer W at the time of slot S to accommodate stand-by wafer W is empty regardless of the order in which stand-by wafers W are accommodated in buffer transfer units 41", or may be transferred to slot S of cassette C to accommodate stand-by wafer W according to the order in which wafers are accommodated in buffer transfer units 41".

As described above, according to the present exemplary embodiment, wafer W is first disposed in buffer transfer unit 41" by transfer unit 42 for processing area and then is disposed to designated slot S, when slot S to accommodate wafer W having been processed is not empty. As a result, wafer W having been processed is not disposed by mistake to slot S in which unprocessed wafer W is yet disposed, but wafer W having been processed is disposed to cassette C in an empty slot S.

Furthermore, in the present exemplary embodiment, unprocessed wafer W is repeatedly carried-out, and confirming unit 11 determines whether or not designated slot S is empty whenever unprocessed wafer W is carried-out from cassette C. And, wafer W is carried-in and disposed to slot S from buffer transfer unit 41" when slot S to be designated is empty. As a result, the time period in which wafer W is accommodated in buffer transfer unit 41" can be extremely short.

Further, in the context described above, while the first to third exemplary embodiments are explained separately, but any or all of the first to third exemplary embodiments may combined.

That is, for example, when designated slot S is not empty based on the combination of the first and third exemplary embodiments, wafer W is first carried-in and disposed in buffer transfer unit 41" by transfer unit 42 for processing area, and when wafer cannot be carried-in buffer transfer unit 41", the transfer of wafer having been processed is first stopped, and the carrying-out of unprocessed wafer W only may be performed from cassette C. And, when stand-by wafer W begins to be carried-out as designated slots S are becoming gradually empty and designated slot S is finally not empty, all wafers W in the substrate processing apparatus may be carried-in and accommodated in emergency cassette C' by transfer unit 42 for processing area and transfer unit 32 for carrying-in/out.

In addition, for example, when both buffer cassette C" and buffer transfer unit 41" are installed, and designated slot S is not empty according to the combination of the second and third exemplary embodiments, wafer W may be carried-in to buffer cassette C" and buffer transfer unit 41" by transfer units 32, 42.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus including a disposing area, a transfer area and a processing area, comprising:
   a substrate processing unit disposed in the processing area and configured to process a target substrate taken out from a cassette disposed in the disposing area and having plurality of slots each configured to accommodate a substrate to be processed in the substrate processing unit;
   a transfer unit disposed in the transfer area and configured to transfer the target substrate from the cassette to the substrate processing unit, and transfer the target substrate processed in the substrate processing unit from the substrate processing unit to the cassette so as to dispose the target substrate in the cassette;
   a confirming unit configured to detect whether or not a slot of the cassette designated to the target substrate to be accommodated after the target substrate has been processed in the substrate processing unit is empty; and a control unit configured to read the designated slot of the cassette based on a result from the confirming unit, and determine whether or not the designated slot of the cassette is empty, after the target substrate has been processed in the substrate processing unit but before the target substrate is disposed in the cassette, wherein the control unit stops the transfer of the target substrate processed in the substrate processing unit toward the designated slot of the cassette by the transfer unit when the control unit determines that the designated slot of the cassette is not empty, and the transfer unit carries all substrates in the substrate processing apparatus into an emergency cassette provided in the disposing area when the slot read by the control unit is not empty.

2. A substrate processing method using a substrate processing apparatus including a disposing area, a transfer area and a processing area, comprising:

transferring a target substrate from a cassette disposed in the disposing area and having a plurality of slots each configured to accommodate a substrate to be processed to a substrate processing unit disposed in the processing area using a transfer unit provided in the transfer area;

processing the target substrate in the substrate processing unit provided in the processing area;

confirming by a confirming unit whether or not a slot of the cassette designated by the target substrate to be accommodated after the tar et substrate has been processed in the substrate processing unit is empty;

reading by a control unit the slot of the cassette designated to the target substrate based on a result from the confirming and determining whether or not the slot of the cassette designated to the target substrate is empty, after the target substrate has been processed in the substrate processing unit but before the target substrate is disposed in the cassette; and when it is determined from the reading that the slot of the cassette designated to the target substrate is not empty, stopping the transfer toward the designated slot of the cassette and carrying all substrates in the substrate processing apparatus into an emergency cassette provided in the disposing area.

3. A non-transitory computer-readable recording medium storing a computer executable program that, when executed, causes a computer to execute a substrate processing method using a substrate processing apparatus including a disposing area, a transfer area and a processing area, the method comprising:

transferring a target substrate from a cassette disposed in the disposing area and having a plurality of slots each configured to accommodate a substrate to be processed to a substrate processing unit disposed in the processing area using a transfer unit provided in the transfer area;

processing the target substrate in the substrate processing unit provided in the processing area;

confirming by a confirming unit whether or not a slot of the cassette designated by the tar et substrate to be accommodated after the tar et substrate has been processed in the substrate processing unit is empty;

reading by a control unit the slot of the cassette designated to the target substrate based on a result fro the confirming and determining whether or not the slot of the cassette designated to the target substrate is empty, after the target substrate has been processed in the substrate processing unit but before the target substrate is disposed in the cassette; and when it is determined from the reading that the slot of the cassette designated to the target substrate is not empty, stopping the transfer toward the designated slot of the cassette and carrying all substrates in the substrate processing apparatus into an emergency cassette provided in the disposing area.

* * * * *